United States Patent [19]
Huang

[11] Patent Number: 5,607,881
[45] Date of Patent: Mar. 4, 1997

[54] METHOD OF REDUCING BURIED CONTACT RESISTANCE IN SRAM

[75] Inventor: Jenn M. Huang, Hsin-Chu, Taiwan

[73] Assignee: Taiwan Semiconductor Manufacturing Company Ltd., Hsin-Chu, Taiwan

[21] Appl. No.: 503,173

[22] Filed: Sep. 25, 1995

[51] Int. Cl.⁶ .............................. H01L 21/44; H01L 21/48
[52] U.S. Cl. ........................... 437/195; 437/203; 437/52; 148/DIG. 20
[58] Field of Search ................... 437/47–48, 52, 437/60, 195, 203; 148/DIG. 20

[56] References Cited

U.S. PATENT DOCUMENTS 5,187,122  2/1993  Bonis ..................................... 437/200
5,350,712  9/1994  Shibata ................................... 437/195

FOREIGN PATENT DOCUMENTS

4313239  11/1992  Japan ..................................... 437/40

Primary Examiner—Jey Tsai
Attorney, Agent, or Firm—George O. Saile; Rosemary L. S. Pike

[57] ABSTRACT

A new method of forming improved buried contact junctions is described. A buried contact is formed within a semiconductor substrate by dopant diffusion from an overlying polysilicon layer. The second polysilicon layer is patterned to form a polysilicon contact overlying the buried contact junction wherein a portion of the buried contact within said semiconductor substrate is exposed. The polysilicon layer is overetched whereby a trench is etched into the exposed semiconductor substrate. An extra implant is implanted into the semiconductor substrate around the trench. Source and drain regions are formed wherein the buried contact connects to one of the source and drain regions through the extra implant around the trench completing the formation of the buried contact in the fabrication of an integrated circuit.

30 Claims, 9 Drawing Sheets

METHOD OF REDUCING BURIED CONTACT RESISTANCE IN SRAM

BACKGROUND OF THE INVENTION (1) Field of the Invention

The invention relates to the fabrication of integrated circuit devices, and more particularly, to a method of improved buried contact resistance in the fabrication of integrated circuits.

(2) Description of the Prior Art

Figure 1:
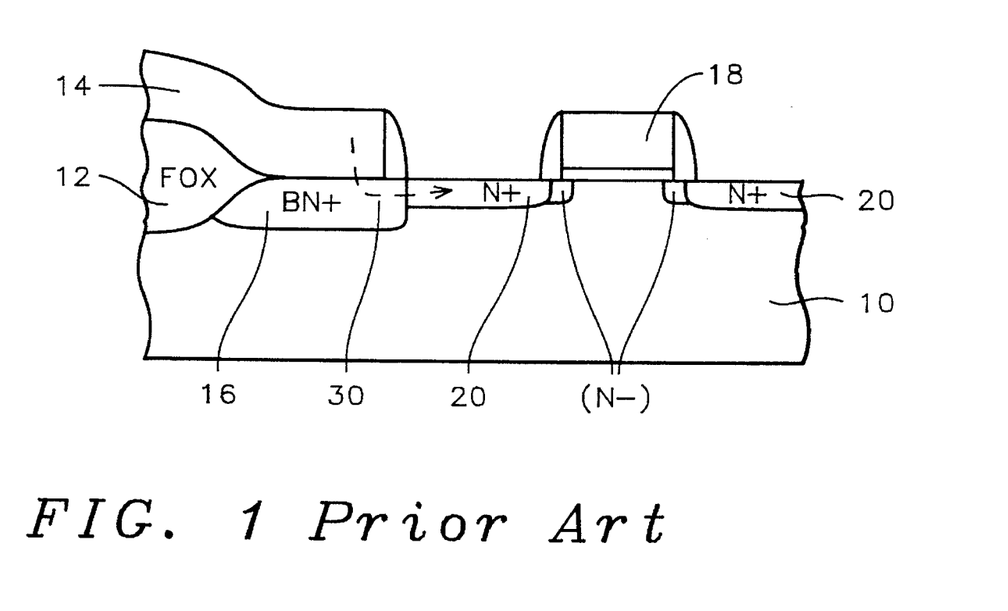
FIGS. 1 through 3 schematically illustrate in cross-sectional representation an embodiment of the prior art.

Referring to FIG. 1, a typical buried contact is formed by depositing a doped layer of polysilicon 14 over and on the planned buried contact regions in a semiconductor substrate 10 and heating the structure. The buried contact regions 16 are doped by outdiffusion of dopants from the doped polysilicon layer into the silicon substrate. The doped polysilicon layer 14 is allowed to remain on the buried contact regions as their contacts. Gate electrodes 18 and source and drain regions 20 are formed in and on the semiconductor substrate. One of the source/drain regions 20 contacts the buried contact region 16. The desired current path is illustrated by dotted line 30 in FIG. 1. The path goes from the polysilicon 14 directly through the buried N+ region 16 to the N+ source or drain region 20.

Figure 2:
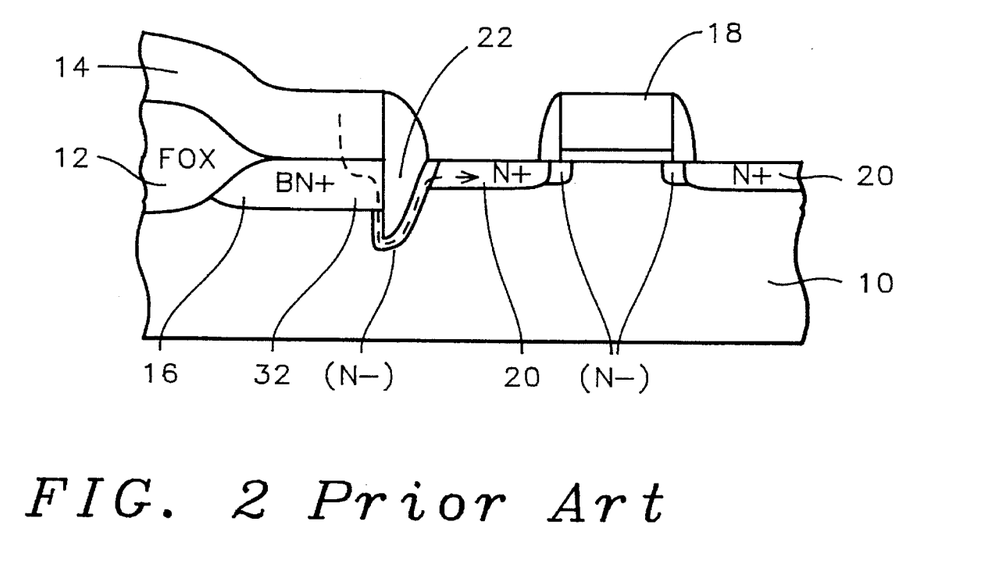
Figure 3:
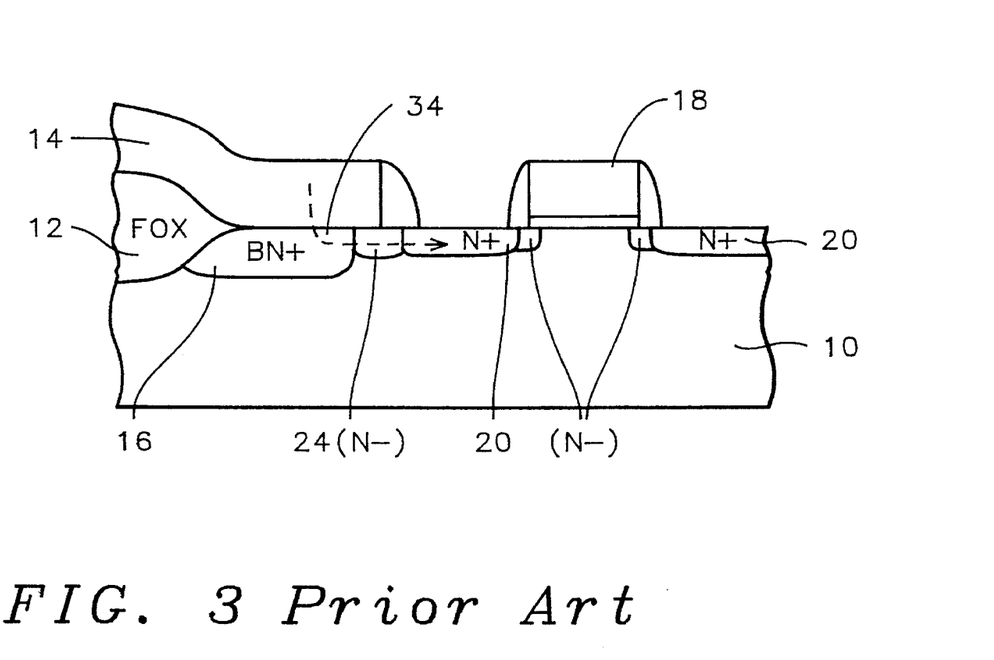

If there is misalignment of the mask during etching of the polysilicon 18, the resistance of the buried contact will be increased. If the mask is shifted to the left, as shown in FIG. 2, a portion of the semiconductor substrate within the buried contact area will be exposed. During polysilicon overetching, a buried contact trench 22 will be etched. The current path in FIG. 2 is illustrated by dotted line 32. In this case, the path goes from the polysilicon 14 through the buried contact 16, then around the trench 22 and finally to the source/drain region 20. The area around the trench 22 is N− because the N− dopant, for an NLDD MOSFET structure, is implanted before the sidewall formation. Since N− is resistive rather than conductive, resistance is increased, leading to decreased device performance. If the mask is shifted to the right, as shown in FIG. 3, the N+ source/drain regions 20 will not contact the buried N+ region 16 directly, but an N− region 24 will come between the two N+ regions. The current path in FIG. 3 is illustrated by dotted line 34. In this case, the path goes from the polysilicon 14 through the buried contact 16, through the N− region 24, and finally to the source/drain region 20. As in the case above, the N− region adds resistance, decreasing device performance.

U.S. Pat. No. 5,350,712 to Shibata teaches the use of an additional metal width around a metal line to overcome mask misalignment problems causing etching of the semiconductor substrate. Co-pending U.S. patent application Ser. No. 08/405719, now U.S. Pat. No. 5,494,848 to H. W. Chin filed on Mar. 17, 1994 teaches a method using an inverse tone of the buried contact mask to make a photoresist mask covering the buried junction area and adding an additional bias-on either side of the mask to protect the buried junction area during over-etch so that a misalignment of the mask will not cause the formation of a buried contact trench. Co-pending U.S. Pat. application Ser. No. 08/488,764, now U.S. Pat. No. 5,525,552 to J. M. Huang uses a high dielectric constant spacer material for the LDD spacer to provide better immunity of the buried contact trench.

SUMMARY OF THE INVENTION

A principal object of the present invention is to provide an effective and very manufacturable method of forming buried contact junctions with improved buried contact resistance.

Another object of the present invention is to provide a method of forming buried contact junctions with improved buried contact resistance which will not be harmed by mask misalignment.

In accordance with the objects of this invention a new method of forming improved buried contact junctions is achieved. A buried contact is formed within a semiconductor substrate by dopant diffusion from an overlying polysilicon layer. The second polysilicon layer is patterned to form a polysilicon contact overlying the buried contact junction wherein a portion of the buried contact within said semiconductor substrate is exposed. The polysilicon layer is overetched whereby a trench is etched into the exposed semiconductor substrate. An extra implant is implanted into the semiconductor substrate around the trench. Source and drain regions are formed wherein the buried contact connects to one of the source and drain regions through the extra implant around the trench completing the formation of the buried contact in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Referring to FIGS. 4 through 8B, a first preferred embodiment of the present invention will be described. Note that the drawing figures illustrate an N channel MOSFET integrated circuit device. However, it is well understood by those skilled in the art that a P channel FET integrated circuit device could be formed by simply substituting opposite polarities to those given for the N channel embodiment. Also, in a similar way, a CMOSFET could be formed by making both N channel and P channel devices upon the same substrate.

Figure 4:
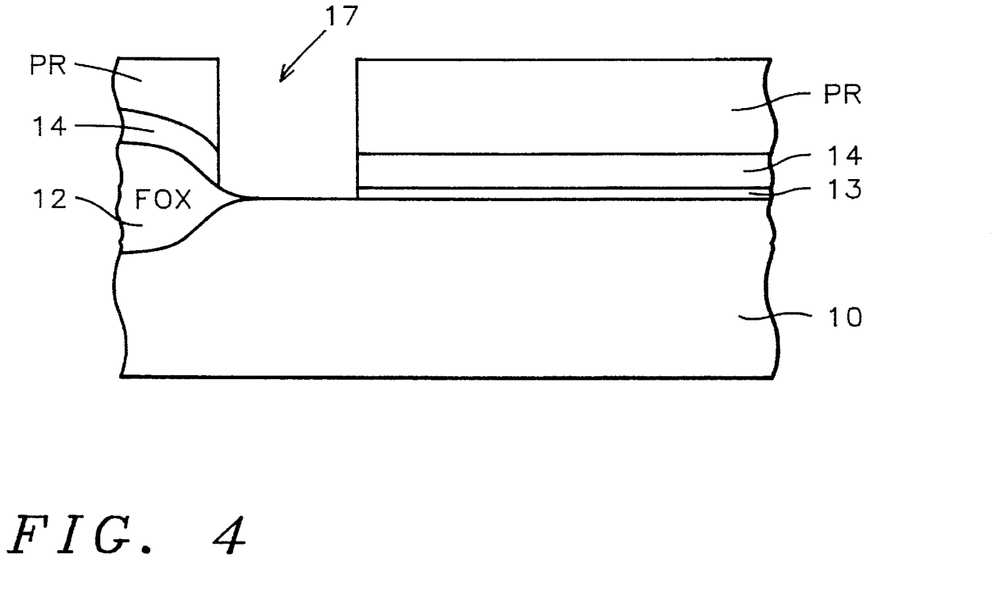
FIGS. 4–5, 6A–6B, 7A–7B and 8A–8B schematically illustrate in cross-sectional representation a preferred embodiment of the present invention.

Referring now more particularly to FIG. 4, there is shown a portion of a partially completed integrated circuit. There is shown a monocrystalline semiconductor substrate 10 in which there are formed field oxide regions 12. A gate oxide layer 13 is grown on the surface of the semiconductor substrate, typically to a thickness of between about 70 to 200 Angstroms. The polysilicon layer 14 is blanket deposited by low pressure chemical vapor deposition (LPCVD) at a temperature of between about 580° to 650° C. to a thickness of between about 200 to 600 Angstroms.

A buried contact mask is used to make a photoresist mask PR overlying the polysilicon layer 14. The polysilicon and gate oxide layers are etched away where they are not covered by the mask to form the buried contact opening 17. While a single thick polysilicon layer is an acceptable alternative, a split polysilicon process is preferred and will be described herein.

Figure 5:
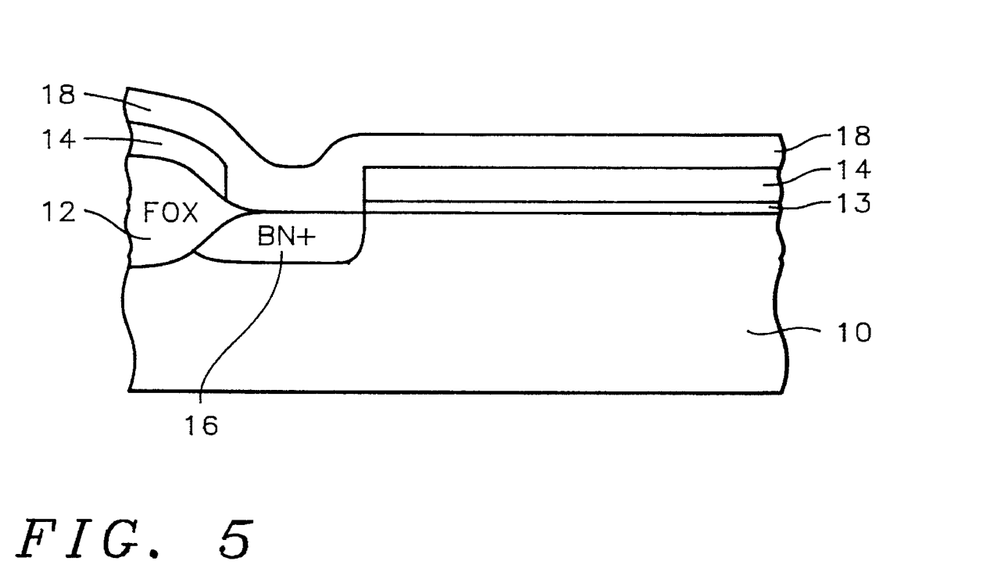

Referring now to FIG. 5, a second layer of polysilicon 18 is deposited by LPCVD to a thickness of between about 1000 to 3000 Angstroms. The buried contact is formed either by diffusion or by ion implanting the top polysilicon layer 18. For diffusion, $P_{31}$ or $POCl_3$ are used. For ion implantation, arsenic or $P_{31}$ ions are implanted to produce N+ regions or boron or $BF_2$ ions are implanted to produce P+ regions. Preferred dosages are in the range of between about 1 E 15 to 5 E 15 atoms/cm$^2$. Alternatively, the polysilicon layer 18 could be in-situ doped.

The dopants are driven into the silicon substrate at a temperature of between about 850° to 1000° C. to form buried junction 16. This is done during $POCl_3$ doping thermal budget or by subsequent thermal budget.

Figure 6A:
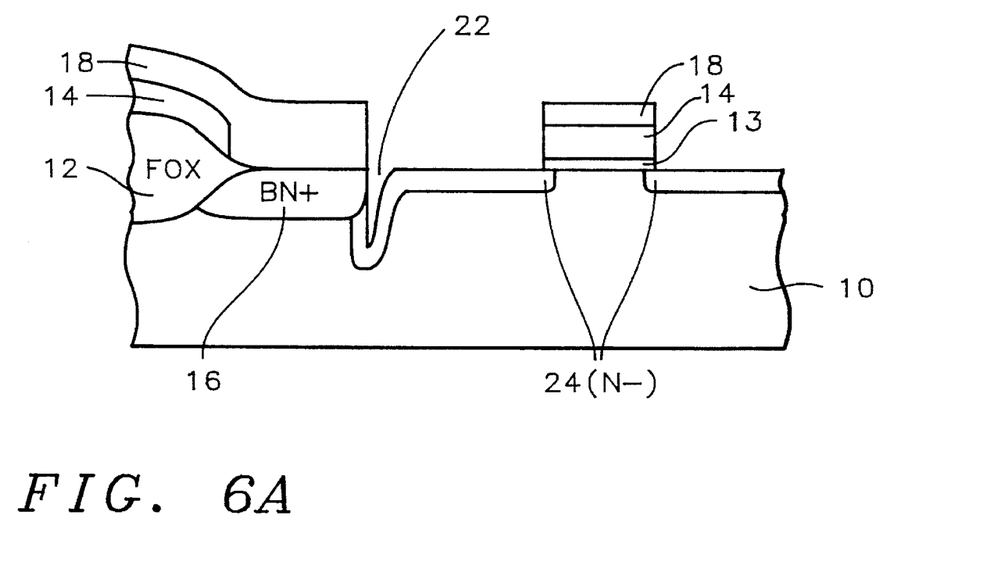
Figure 6B:
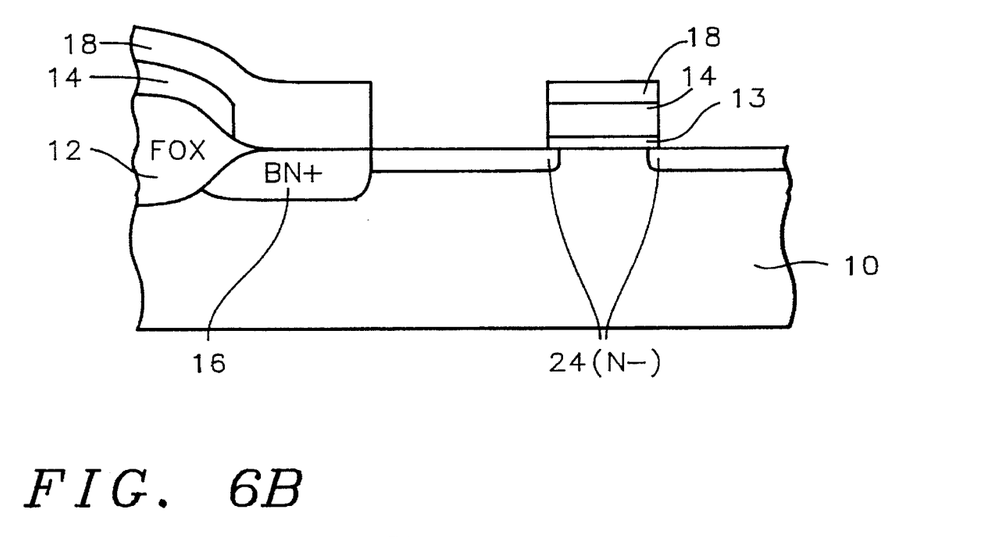
Figure 7A:
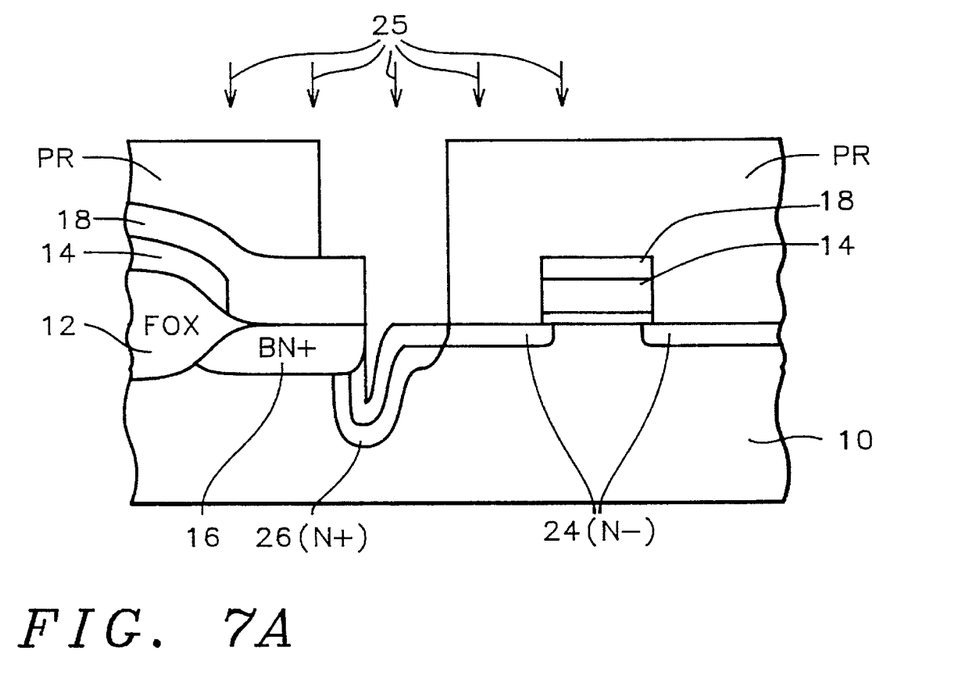
Figure 7B:
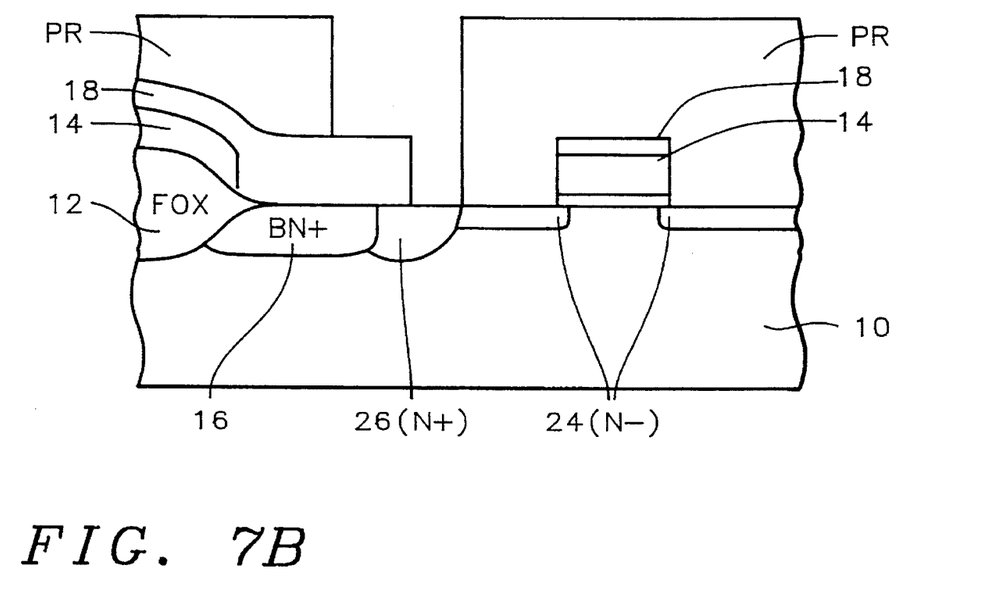

The main polysilicon etch, the results of which are illustrated in FIGS. 6A and 6B, is typically a plasma etch or a reactive ion etching with an etch stop at the gate silicon oxide layer 13. During overetching to remove polysilicon residue, a buried contact trench 22 is etched into the semiconductor substrate. In FIGS. 6B, 7B, and 8B, the photomask has been slightly misaligned to the right so that a portion of the semiconductor substrate not containing the buried contact region is underlying the polysilicon contact 14,18.

Lightly doped source and drain implantations are made into the semiconductor substrate where it is not covered by a photoresist mask to result in the lightly doped regions 24 illustrated in FIGS. 6A and 6B. At this point, the key steps of the present invention to improve buried contact resistance will be described. The goal is to link up the buried junction and the source/drain junction with an extra high dosage N+ implant. It will be understood by those skilled in the art that an extra high dosage P+ implant will be used in a similar way for a PMOSFET integrated circuit device.

The substrate is covered with a photoresist mask which has been sized up from the original buried contact mask by about 0.2 microns. This sizing is enough to cover the alignment tolerance of current steppers for 0.5 micron or below technology. A high dosage N+ implant 25 is performed. The dosage is greater than about 1 E 14 atoms/cm$^2$ and may be made from multiple angles. FIG. 7A illustrates the extra implant 26 in the case where the polysilicon photomask was shifted left. FIG. 7B illustrates the extra implant 26 in the case where the polysilicon photomask was shifted right.

Figure 8A:
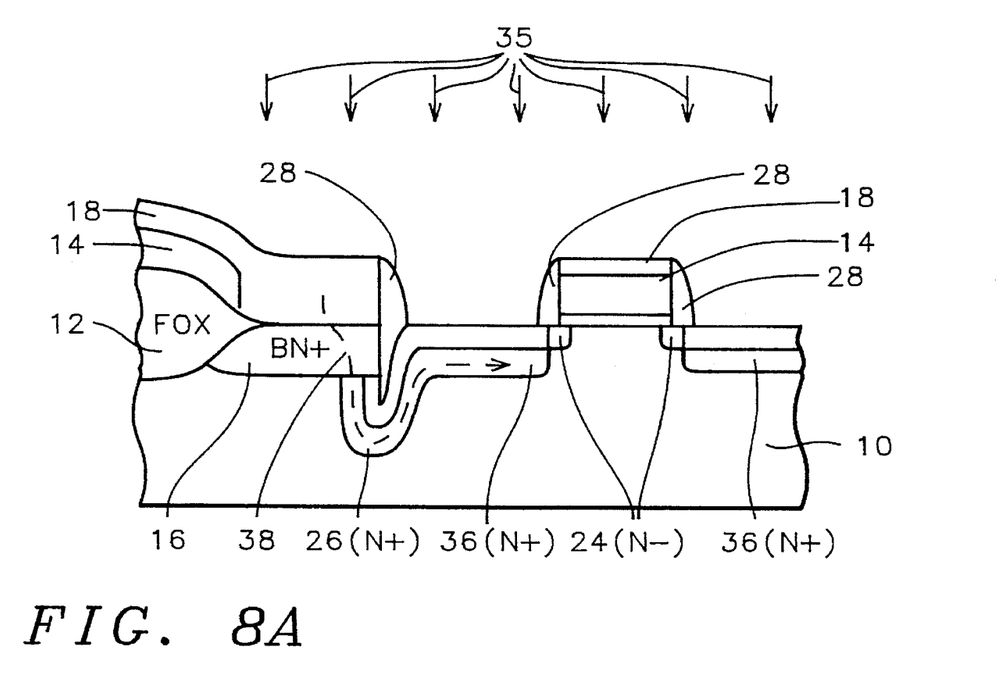
Figure 8B:
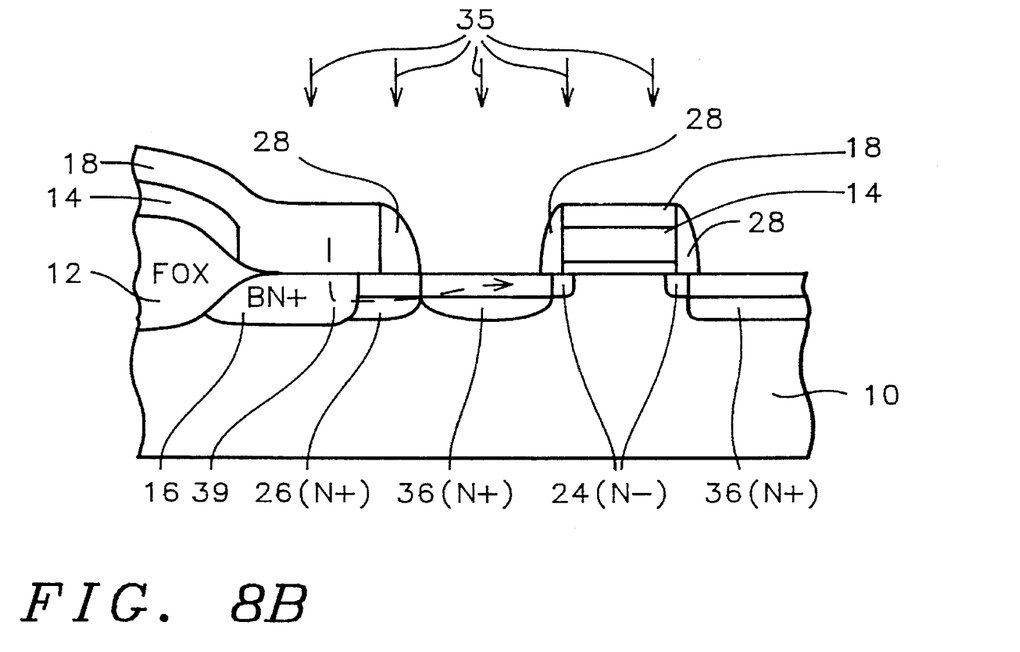

After the photoresist layer is removed, silicon oxide spacers 28 are formed on the sidewalls of the polysilicon gate electrode and contact 14,18 as shown in FIGS. 8A and 8B. The substrate is again masked for the source/drain implantation. Ions 35 are implanted into the substrate where it is not covered by a mask to form source and drain regions 36. FIG. 8A illustrates the substrate in which the polysilicon photomask was shifted to the left and FIG. 8B illustrates the substrate in which the polysilicon photomask was shifted to the right. It can be seen that the extra high dosage implant 26 in both cases provides current paths 38 and 39, in FIGS. 8A and 8B, respectively, that do not go through any N− resistive areas. This provides for improved device performance.

Referring now to FIGS. 9A through 11B, a second preferred embodiment of the present invention will be described. Processing is as described for the first embodiment through the polysilicon etching and overetching as shown in FIGS. 4 through 6A and 6B. Next, lightly doped regions 24 are formed.

Figure 9A:
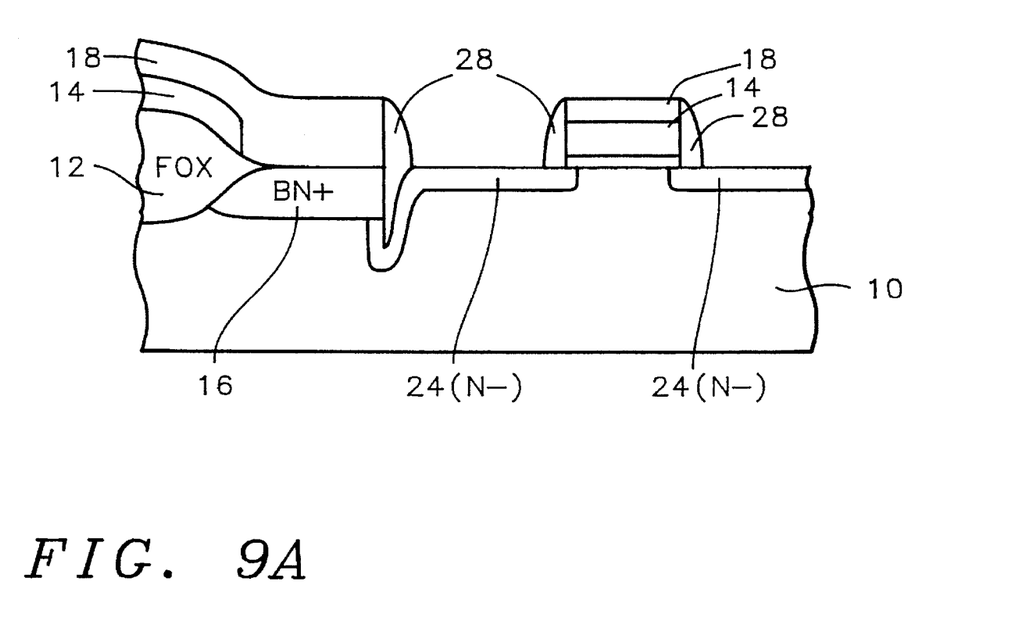
FIGS. 9A–9B, 10A–10B and 11A–11B schematically illustrate in cross-sectional representation a second preferred embodiment of the present invention.
Figure 9B:
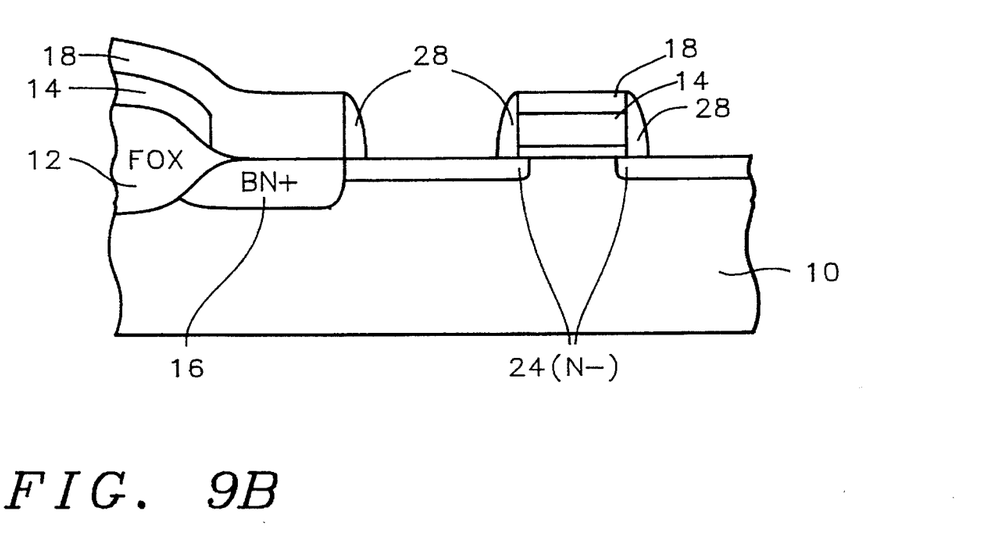

In this embodiment, the silicon oxide spacers 28 are formed on the sidewalls of the polysilicon gate electrode and the polysilicon contact following the formation of the lightly doped regions 24, as shown in FIGS. 9A and 9B.

Figure 10A:
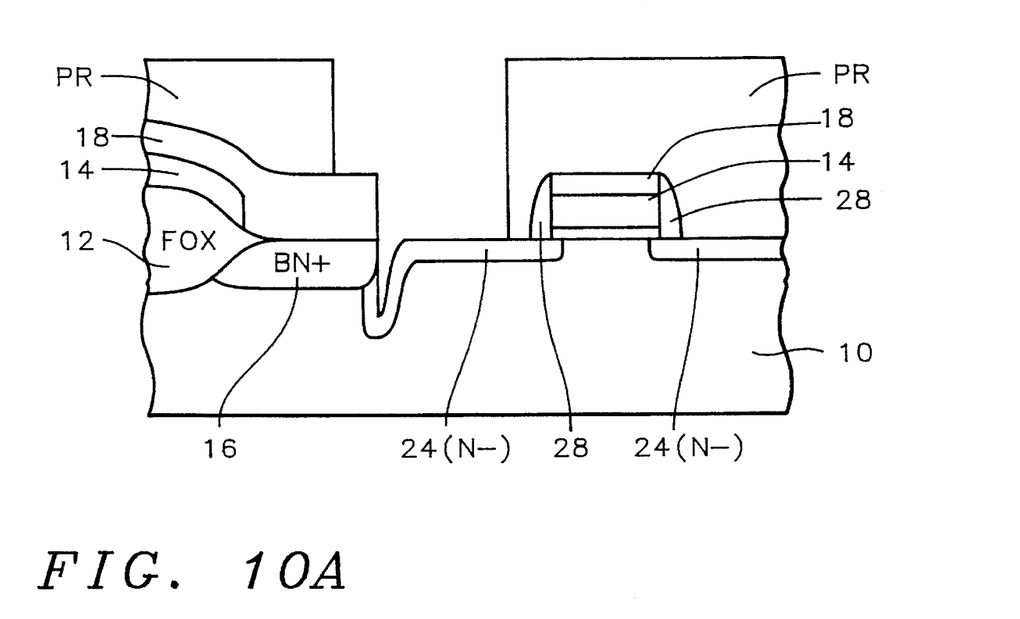
Figure 10B:
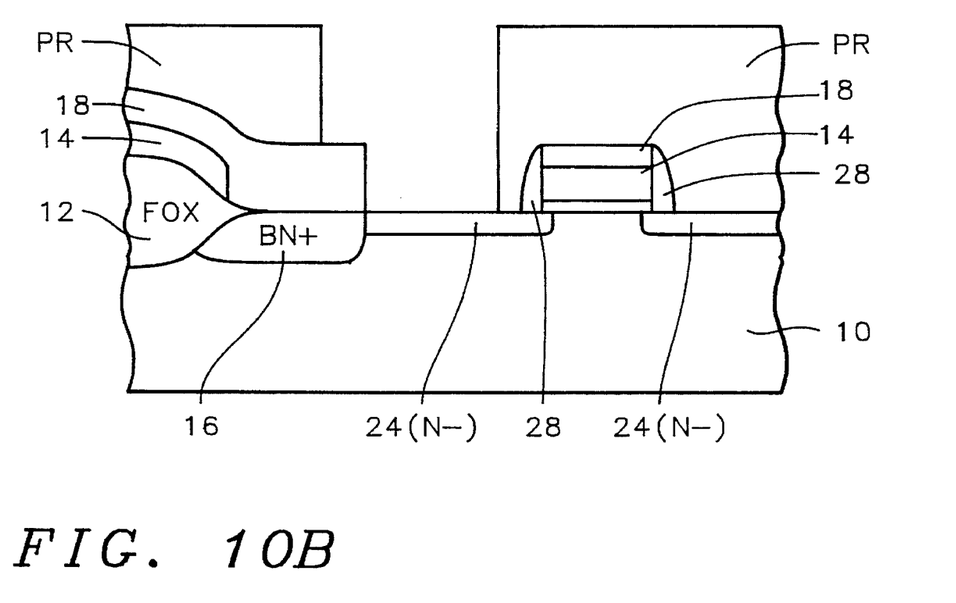

Referring now to FIGS. 10A and 10B, the substrate is covered with a photoresist mask which has been sized up from the original buried contact mask by about 0.2 microns and the spacer 28 on the sidewall of the polysilicon contact 14,18 is etched away. Next, the source/drain ion implant 35 is performed to form source/drain regions 36 illustrated in FIGS. 11A and 11B.

Figure 11A:
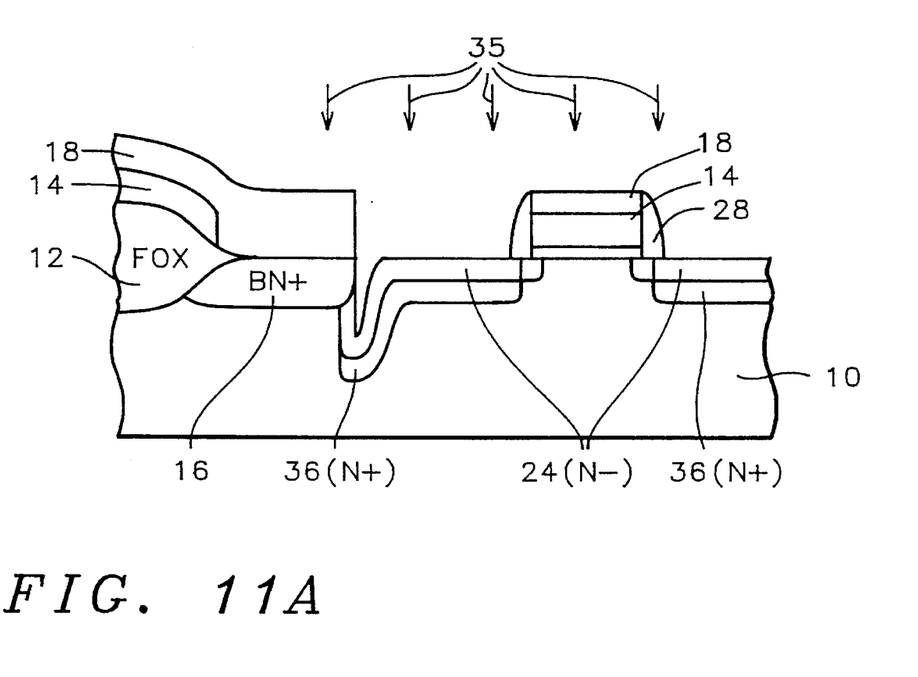
Figure 11B:
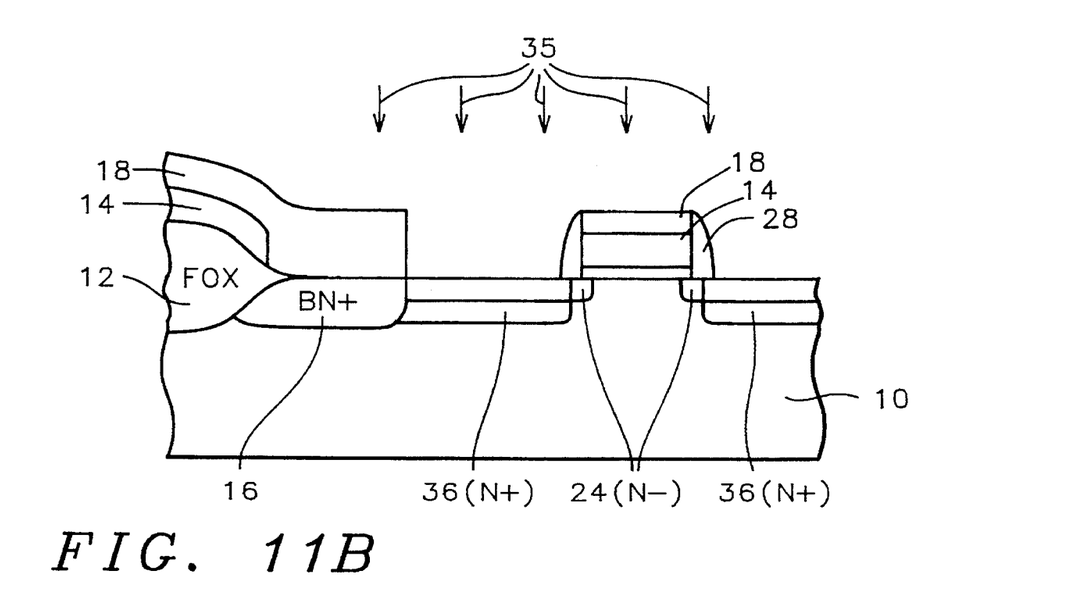
Figure 12:
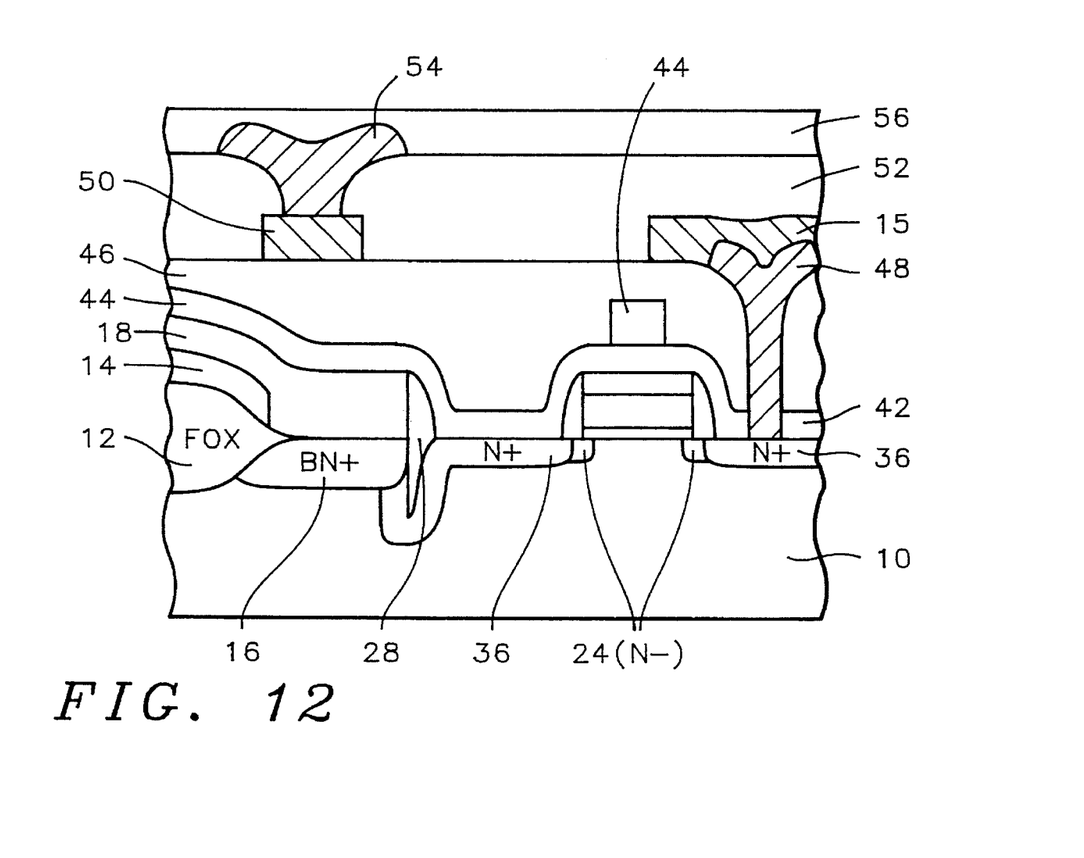
FIG. 12 schematically illustrates in cross-sectional representation a preferred embodiment of this invention for a static random access memory (SRAM).

FIG. 11A illustrates the substrate in which the polysilicon photomask was shifted to the left and FIG. 11B illustrates the substrate in which the polysilicon photomask was shifted to the right. In this embodiment, since the spacer 28 on the sidewall of the polysilicon contact 14,18 has been etched away before the source/drain ion implant, the source/drain N+ implant penetrates under the buried contact trench in FIG. 11A. In FIG. 11B, the N+ implant extends all the way to the buried contact 16. Subsequent thermal budget drives in the implant to meet the buried contact 16 by lateral diffusion of the impurity. The first and second embodiments of the present invention can be directly applied to static random access memory (SRAM) buried contacts or to any device utilizing a buried contact for connecting polysilicon and the semiconductor substrate. A completed SRAM is illustrated in FIG. 12. FIG. 12 follows FIG. 8A, but would look very similar for all embodiments of the invention. Polysilicon gate electrode and polysilicon contact 14,18 are shown. Buried contact 16 and source and drain regions 36, which may be N+ or P+, are shown within the semiconductor substrate. The first polysilicon contact and gate have been covered with an interpoly oxide 42 and a second polysilicon layer 44 has been patterned and covered by an interlevel dielectric 46. A contact opening has been made to source/drain region 36 and filled with, for example, a tungsten plug 48 and aluminum metallurgy 50. Intermetal dielectric layer 52 and second level metallurgy 54 are covered by passivation layer 56 to complete the fabrication of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. A method of forming a buried contact in a semiconductor substrate in the fabrication of an integrated circuit comprising:

providing a layer of gate silicon oxide over the surface of said semiconductor substrate;

depositing a first polysilicon layer overlying said gate silicon oxide layer;

etching away said first polysilicon and said gate silicon oxide layers where they are not covered by a buried contact mask to provide an opening to said semiconductor substrate;

depositing a second layer of polysilicon over said first polysilicon layer and over said semiconductor substrate within said opening;

doping said second polysilicon layer with dopant;

driving in said dopant to form a buried contact junction within said semiconductor substrate under said opening;

patterning said second polysilicon layer to form a polysilicon contact overlying said buried contact junction wherein a portion of said buried contact junction within said semiconductor substrate is exposed;

overetching said second polysilicon layer whereby a trench is etched into said exposed buried contact junction;

covering said substrate with a second mask wherein said second mask is sized up from said buried contact mask enough to compensate for misalignment;

implanting an extra implant into said semiconductor substrate not covered by said second mask around said trench; and forming source and drain regions wherein said buried contact junction connects to one of said source and drain regions through said extra implant around said trench completing the formation of said buried contact in the fabrication of an integrated circuit.

2. The method according to claim 1 wherein said second polysilicon layer is doped by diffusion of $P_{31}$.

3. The method according to claim 1 wherein said second polysilicon layer is doped by diffusion of $POCl_3$.

4. The method according to claim 1 wherein said second polysilicon layer is doped by ion implant of arsenic ions with a dosage of between about 1 E 15 to 5 E 15 atoms/cm$^2$.

5. The method according to claim 1 wherein said second polysilicon layer is doped by ion implant of phosphorus ions with a dosage of between about 1 E 15 to 5 E 15 atoms/cm$^2$.

6. The method according to claim 1 wherein said drive-in of said buried contact is performed at between about 850° to 1000° C.

7. The method according to claim 1 wherein said extra implant has a high dosage of greater than about 1 E 14 atoms/cm$^2$.

8. The method according to claim 1 wherein said extra implant is performed at multiple angles.

9. A method of forming a buried contact in a semiconductor substrate in the fabrication of an integrated circuit comprising:

providing a layer of gate silicon oxide over surface of said semiconductor substrate;

depositing a first polysilicon layer overlying said gate silicon oxide layer;

etching away said first polysilicon and said gate silicon oxide layers where they are not covered by a buried contact mask to provide an opening to said semiconductor substrate;

depositing a second layer of polysilicon over said first polysilicon layer and over said semiconductor substrate within said opening;

doping said second polysilicon layer with dopant;

driving in said dopant to form a buried contact junction within said semiconductor substrate under said opening;

patterning said second polysilicon layer to form a polysilicon contact overlying said buried contact junction wherein a portion of said semiconductor substrate adjacent to said buried contact junction is exposed;

overetching said second polysilicon layer;

covering said substrate with a second mask wherein said second mask is sized up from said buried contact mask enough to compensate for misalignment;

implanting an extra implant into said exposed semiconductor substrate not covered by said second mask adjacent to said buried contact; and forming source and drain regions wherein said buried contact connects to one of said source and drain regions through said extra implant adjacent to said buried contact completing the formation of said buried contact in the fabrication of an integrated circuit.

10. The method according to claim 9 wherein said second polysilicon layer is doped by diffusion of $P_{31}$.

11. The method according to claim 9 wherein said second polysilicon layer is doped by diffusion of $POCl_3$.

12. The method according to claim 9 wherein said second polysilicon layer is doped by ion implant of arsenic ions with a dosage of between about 1 E 15 to 5 E 15 atoms/cm$^2$.

13. The method according to claim 9 wherein said second polysilicon layer is doped by ion implant of phosphorus ions with a dosage of between about 1 E 15 to 5 E 15 atoms/cm$^2$.

14. The method according to claim 9 wherein said drive-in of said buried contact is performed at between about 850° to 1000° C.

15. The method according to claim 9 wherein said extra implant has a high dosage of greater than about 1 E 14 atoms/cm$^2$.

16. The method according to claim 9 wherein said extra implant is performed at multiple angles.

17. The method according to claim 9 wherein said integrated circuit is a static random access memory (SRAM).

18. A method of forming a buried contact in a semiconductor substrate in the fabrication of an integrated circuit comprising:

providing a layer of gate silicon oxide over the surface of said semiconductor substrate;

depositing a first polysilicon layer overlying said gate silicon oxide layer;

etching away said first polysilicon and said gate silicon oxide layers where they are not covered by a buried contact mask to provide an opening to said semiconductor substrate;

depositing a second layer of polysilicon over said first polysilicon layer and over said semiconductor substrate within said opening;

doping said second polysilicon layer with dopant; driving in said dopant to form a buried contact junction within said semiconductor substrate under said opening;

patterning said second polysilicon layer to form a polysilicon gate electrode and a polysilicon contact overlying said buried contact junction wherein a portion of said buried contact junction within said semiconductor substrate is exposed;

overetching said second polysilicon layer wherein a trench is etched into said exposed buried contact junction;

forming first spacers on sidewalls of said gate electrode and second spacers on sidewalls of said polysilicon contact wherein one of said second spacers on the sidewall of said polysilicon contact fills said trench;

covering said substrate with a second mask wherein said second mask is sized up from said buried contact mask enough to compensate for misalignment and wherein said one of said second spacers filling said trench is not covered by said second mask;

etching away said one of said second spacers not covered by said second mask wherein said trench is exposed; and implanting ions to form source and drain regions wherein said ions are also implanted surrounding said exposed trench and wherein said buried contact junction connects to one of said source and drain regions through said implant around said trench completing the formation of said buried contact in the fabrication of an integrated circuit.

19. The method according to claim 18 wherein said second polysilicon layer is doped by diffusion of $P_{31}$.

20. The method according to claim 18 wherein said second polysilicon layer is doped by diffusion of $POCl_3$.

21. The method according to claim 18 wherein said second polysilicon layer is doped by ion implant of arsenic ions with a dosage of between about 1 E 15 to 5 E 15 atoms/$cm^2$.

22. The method according to claim 18 wherein said second polysilicon layer is doped by ion implant of phosphorus ions with a dosage of between about 1 E 15 to 5 E 15 atoms/$cm^2$.

23. The method according to claim 18 wherein said drive-in of said buried contact is performed at between about 850° to 1000° C.

24. The method according to claim 18 wherein said integrated circuit is a static random access memory (SRAM).

25. A method of forming a buried contact in a semiconductor substrate in the fabrication of an integrated circuit comprising:

providing a layer of gate silicon oxide over the surface of said semiconductor substrate;

depositing a first polysilicon layer overlying said gate silicon oxide layer;

etching away said first polysilicon and said gate silicon oxide layers where they are not covered by a buried contact mask to provide an opening to said semiconductor substrate;

depositing a second layer of polysilicon over said first polysilicon layer and over said semiconductor substrate within said opening;

doping said second polysilicon layer with dopant;

driving in said dopant to form a buried contact junction within said semiconductor substrate under said opening;

patterning said second polysilicon layer to form a polysilicon gate electrode and a polysilicon contact overlying said buried contact junction wherein a portion of said semiconductor substrate adjacent to said buried contact junction is exposed;

overetching said second polysilicon layer;

forming first spacers on sidewalls of said gate electrode and second spacers on sidewalls of said polysilicon contact wherein one of said second spacers on the sidewall of said polysilicon contact covers said exposed portion of said semiconductor substrate adjacent to said buried contact;

covering said substrate with a second mask wherein said second mask is sized up from said buried contact mask enough to compensate for misalignment and wherein said one of said second spacers covering said exposed portion of said semiconductor substrate adjacent to said buried contact is not covered by said second mask;

etching away said one of said second spacers not covered by said second mask wherein said portion of said semiconductor substrate adjacent to said buried contact is again exposed; and implanting ions to form source and drain regions wherein said ions are also implanted into said exposed portion of said semiconductor substrate adjacent to said buried contact and wherein said buried contact junction connects to one of said source and drain regions through said implant adjacent to said buried contact completing the formation of said buried contact in the fabrication of an integrated circuit.

26. The method according to claim 25 wherein said second polysilicon layer is doped by diffusion of $P_{31}$.

27. The method according to claim 25 wherein said second polysilicon layer is doped by diffusion of $POCl_3$.

28. The method according to claim 25 wherein said second polysilicon layer is doped by ion implant of arsenic ions with a dosage of between about 1 E 15 to 5 E 15 atoms/$cm^2$.

29. The method according to claim 25 wherein said second polysilicon layer is doped by ion implant of phosphorus ions with a dosage of between about 1 E 15 to 5 E 15 atoms/$cm^2$.

30. The method according to claim 25 wherein said drive-in of said buried contact is performed at between about 850° to 1000° C.

* * * * *